(12) United States Patent
Ren et al.

(10) Patent No.: US 9,793,108 B2
(45) Date of Patent: Oct. 17, 2017

(54) INTERCONNECT INTEGRATION FOR SIDEWALL PORE SEAL AND VIA CLEANLINESS

(71) Applicant: Applied Materials, Inc., Santa Clara, CA (US)

(72) Inventors: He Ren, San Jose, CA (US); Mehul B. Naik, San Jose, CA (US); Deenesh Padhi, Sunnyvale, CA (US); Priyanka Dash, Menlo Park, CA (US); Bhaskar Kumar, Santa Clara, CA (US); Alexandros T. Demos, Fremont, CA (US)

(73) Assignee: APPLIED MATERIAL, INC., Santa Clara, CA (US)

( * ) Notice: Subject to any disclaimer, the term of this patent is extended or adjusted under 35 U.S.C. 154(b) by 0 days.

(21) Appl. No.: 14/750,778

(22) Filed: Jun. 25, 2015

(65) Prior Publication Data

US 2016/0379819 A1 Dec. 29, 2016

(51) Int. Cl.
| | |
|---|---|
| *H01L 21/02* | (2006.01) |
| *H01L 21/31* | (2006.01) |
| *C23C 16/36* | (2006.01) |
| *H01L 21/3105* | (2006.01) |
| *C23C 16/04* | (2006.01) |
| *C23C 16/48* | (2006.01) |
| *C23C 16/56* | (2006.01) |

(52) U.S. Cl.
CPC ...... *H01L 21/02126* (2013.01); *C23C 16/045* (2013.01); *C23C 16/36* (2013.01); *C23C 16/482* (2013.01); *C23C 16/56* (2013.01); *H01L 21/0234* (2013.01); *H01L 21/02337* (2013.01); *H01L 21/02348* (2013.01); *H01L 21/02359* (2013.01); *H01L 21/3105* (2013.01); *H01L 21/31058* (2013.01)

(58) Field of Classification Search
CPC ......... H01L 21/02277; H01L 21/02167; H01L 21/02203; H01L 21/31058
USPC ......................................................... 438/675
See application file for complete search history.

(56) References Cited

U.S. PATENT DOCUMENTS

| | | | | |
|---|---|---|---|---|
| 4,581,249 A | * | 4/1986 | Kamiya ................... | B05D 1/60 136/258 |
| 6,440,289 B1 | * | 8/2002 | Woo ......................... | C25D 5/18 205/102 |
| 8,043,968 B2 | | 10/2011 | Cui et al. | |
| 8,387,557 B2 | | 3/2013 | Singh et al. | |

(Continued)

OTHER PUBLICATIONS

International Search Report and Written Opinion for International Application No. PCT/US2016/034434 dated Aug. 24, 2016.

*Primary Examiner* — Moazzam Hossain
*Assistant Examiner* — Omar Mojaddedi
(74) *Attorney, Agent, or Firm* — Patterson + Sheridan LLP

(57) ABSTRACT

A method for sealing porous low-k dielectric films is provided. The method comprises exposing a substrate to UV radiation and a first reactive gas, wherein the substrate has an open feature defined therein, the open feature defined by a porous low-k dielectric layer and a conductive material, wherein the porous low-k dielectric layer is a silicon and carbon containing material and selectively forming a pore sealing layer in the open feature on exposed surfaces of the porous low-k dielectric layer using UV assisted photochemical vapor deposition.

19 Claims, 4 Drawing Sheets

(56) References Cited

U.S. PATENT DOCUMENTS

| | | |
|---|---|---|
| 2001/0054769 A1 | 12/2001 | Raaijmakers et al. |
| 2006/0108320 A1 | 5/2006 | Lazovsky et al. |
| 2008/0032064 A1* | 2/2008 | Gordon ............... C23C 16/0218 427/578 |
| 2009/0286394 A1 | 11/2009 | Ko et al. |
| 2010/0018460 A1 | 1/2010 | Singh et al. |
| 2010/0093187 A1* | 4/2010 | Lee ........................ C23C 16/26 438/780 |
| 2010/0200993 A1 | 8/2010 | Cui et al. |
| 2010/0320617 A1* | 12/2010 | Arnold .............. H01L 21/76808 257/774 |
| 2011/0111533 A1* | 5/2011 | Varadarajan ...... H01L 21/02063 438/4 |
| 2012/0270339 A1* | 10/2012 | Xie ..................... H01L 21/3105 438/4 |
| 2013/0284204 A1* | 10/2013 | Xie ....................... B08B 7/0021 134/1.1 |
| 2014/0162194 A1* | 6/2014 | Xu .................... H01L 21/02118 430/403 |
| 2015/0162189 A1* | 6/2015 | Xie ................... H01L 21/02118 438/780 |
| 2016/0056071 A1* | 2/2016 | Draeger ........... H01L 23/53238 438/653 |

* cited by examiner

INTERCONNECT INTEGRATION FOR SIDEWALL PORE SEAL AND VIA CLEANLINESS

BACKGROUND

Field

Implementations described herein generally relate to the processing of low-k dielectric films. More specifically, implementations described herein relate to processes for sealing porous low-k dielectric films.

Description of the Related Art

As device scaling continues the dielectric constant (k) of dielectric films in semiconductor fabrication is continually decreasing. Minimizing integration damage on low dielectric constant (low-k) films is one factor that enables a continuing decrease in feature sizes. However, as feature sizes shrink, improvement in the resistive capacitance and reliability of dielectric films becomes a serious challenge.

Porous low-k dielectric films including, for example, carbon-doped oxides (CDO), suffer significant damages after going through back end of line (BEOL) integration due to the contamination in the exposed pores, which leads to larger resistive-capacitive (RC) delay. For example, metal and metal precursors tend to diffuse into the pores of the porous low-k dielectric films. In order to maintain the integrity of the porous low-k dielectric films and to minimize reliability degradation of the dielectric constant of the porous low-k dielectric films, porous low-k dielectric films are typically sealed prior to subsequent metallization processes. However, current sealing processes often lead to increased contact resistance.

Therefore, there is a need for methods of mitigating damage to the porous low-k dielectric films while also reducing contact resistance.

SUMMARY

Implementations described herein generally relate to the processing of low-k dielectric films. More specifically, implementations described herein relate to processes for sealing porous low-k dielectric films. In one implementation, a method for sealing porous low-k dielectric films is provided. The method comprises exposing a substrate to UV radiation and a first reactive gas, wherein the substrate has an open feature defined therein, the open feature defined by a porous low-k dielectric layer and a conductive material, wherein the porous low-k dielectric layer is a silicon and carbon containing material and selectively forming a pore sealing layer in the open feature on exposed surfaces of the porous low-k dielectric layer using UV assisted photochemical vapor deposition.

In another implementation, a method for sealing porous low-k dielectric films is provided. The method comprises exposing a substrate to UV radiation and a nitrogen containing precursor, wherein the substrate has a trench and via defined therein, the trench and via defined by a porous low-k dielectric layer and a conductive material, wherein the porous low-k dielectric layer is a silicon and carbon containing material, selectively forming a pore sealing layer on exposed surfaces of the porous low-k dielectric layer in the via and forming a pore sealing residue on the exposed conductive material in the via using UV assisted photochemical vapor deposition and exposing the substrate to a post-deposition treatment process to remove pore sealing residue from the conductive material of the via.

In yet another implementation, a method for sealing porous low-k dielectric films is provided. The method comprises exposing a substrate to UV radiation and a nitrogen containing precursor, wherein the substrate has a trench and via defined therein, the trench and via defined by a porous low-k dielectric layer and a conductive material, wherein the porous low-k dielectric layer is a silicon and carbon containing material, selectively forming a pore sealing layer on exposed surfaces of the porous low-k dielectric layer in the via and forming a pore sealing residue on the exposed conductive material in the via using UV assisted photochemical vapor deposition and exposing the substrate to a post-deposition treatment process to remove pore sealing residue from the conductive material of the via, wherein a deposition rate of the pore sealing layer is greater than a deposition rate of the pore sealing residue.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
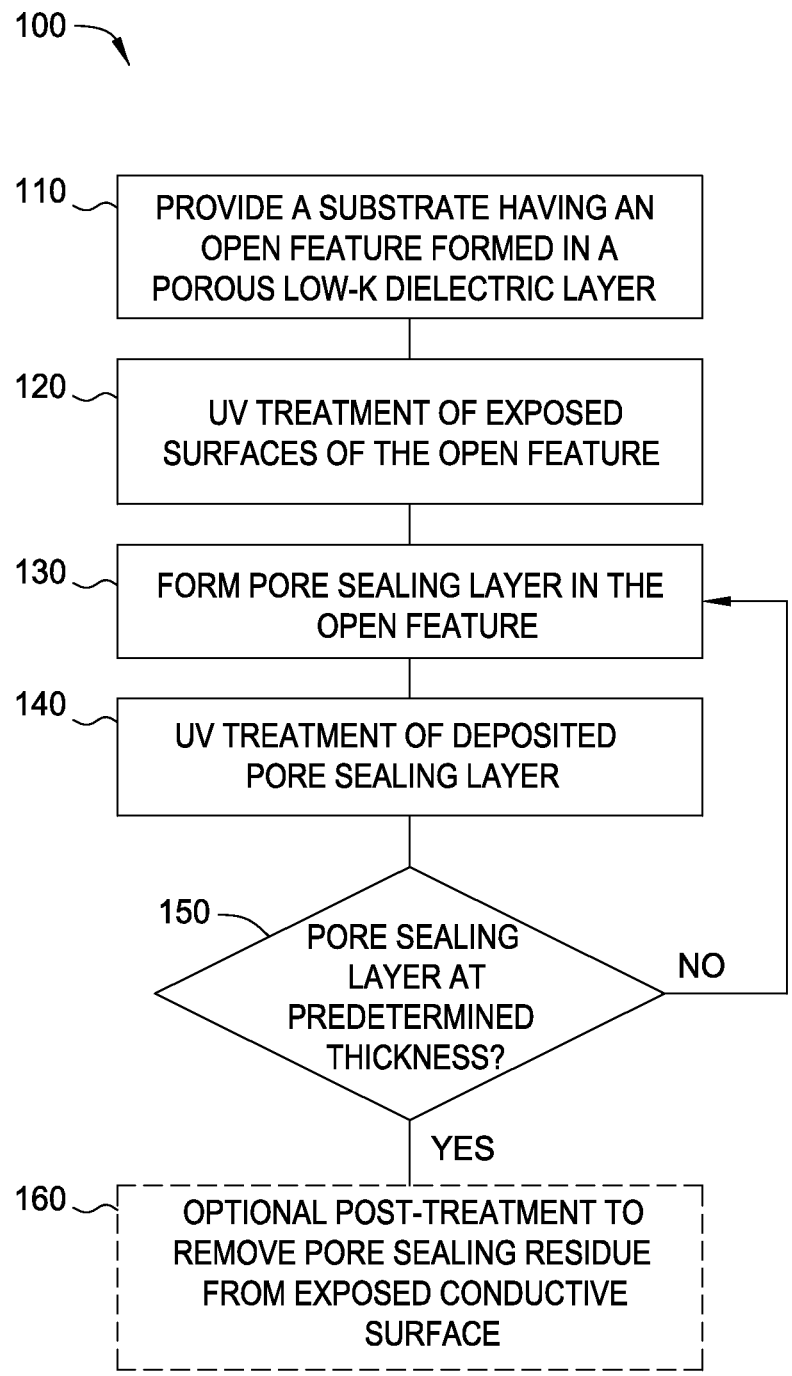
FIG. 1 is a process flow diagram illustrating one method of forming a sealing layer according to implementations described herein.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure describes processes for sealing porous low-k dielectric films. Certain details are set forth in the following description and in FIGS. 1-3 to provide a thorough understanding of various implementations of the disclosure. Other details describing well-known structures and systems often associated with the processing of low-k dielectric films are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Capacitance scaling becomes more challenging as feature dimensions decrease. Lower dielectric constant films (e.g., k value below 2.4) are under consideration to meet the needs of decreasing feature dimensions. These low-k materials typically have high porosity, which necessitates sealing before metallization to prevent metal diffusion and into the porous low-k material and the resulting reliability degradation. Suitable pore sealing processes typically include sidewall passivation as well as a clean via bottom contact. Conventional physical sealing approaches include deposition of a conformal dielectric layer. However, while conformal dielectric layers help passivate sidewalls with a physical film, deposition of the physical film at the bottom of the via increases the difficulty of ensuring via contact.

Other conventional approaches include thermal/plasma-based treatments of the porous low-k sidewall. These thermal/plasma-based treatments densify the porous low-k sidewall, or fill the pores of the sidewall with molecules (pore-stuffing). However, these thermal/plasma-based treatments typically damage the porous low-k material leading to an increase in the dielectric constant of the porous low-k material, which defeats the purpose of using lower-k films. The implementations described herein introduce a method to ensure both sealing of the sidewall pores and via cleanliness, which meet the integration requirements of pore sealing on advanced porous low-k films.

The implementations described herein introduce integration options that enable pore sealing with minimal via resistance (via contact) penalty. The approach includes multiple processes that achieve the above goals. First, a ultraviolet (UV) based sealing process is performed. A silicon-carbon-nitrogen-based precursor is used in the presence of broadband UV energy. Due to the different surface activation energy of the porous low-k film and the conductive material, the deposition rate of the pore sealing film is higher at the surface of the porous low-k film and lower at the surface of the conductive material at the bottom of the via. Typical operation regimes include 200-3,000 Watts UV light power, precursor flows of 100-2,000 sccm with chamber pressure in the range of 100 mTorr to 10 Torr range. Not to be bound by theory, but it is believed that UV light preferentially breaks ligand bonds and attaches the silicon-carbon-nitrogen-based film on the porous low-k surface and minimizes deposition of the pore sealing material on the conductive material.

After deposition of the pore sealing material, UV or thermal based treatments may be used to improve surface bonding in preparation for further deposition. For example, $NH_3$-based UV treatments may be used to prepare the surface of the pore sealing layer with —NH tethering bonds, with operation regimes of 200-1,000 Watts UV light power and 50-800 sccm of $NH_3$ flow rate. The precursor soak and treatment may be cyclic for continuous growth of the pore sealing layer. As a result, a silicon-carbon-nitrogen-containing layer is deposited on the porous low-k surface sealing the nanopores of the porous low-k surface, meanwhile, the silicon-carbon-nitrogen-based residue on the bottom of the via is thinner than the silicon-carbon-nitrogen-based layer deposited on the sidewall.

Second, a post sealing layer deposition residue removal process may be performed. To ensure via ohmic contact, a second process to remove the residue at the bottom of the via may be performed. As an example, a mild wet clean process may be used to remove silicon-carbon-nitrogen-based containing residue layer deposited on the bottom of the via without depleting the pore sealing layer deposited on the sidewall of the via. The wet clean chemistry may contain an oxidizer, such as peroxide and adjusted pH levels for improved dissolution. As another example, a lift-off method may be used to clean the via bottom to remove oxide residues. The process can be an acetic acid clean based oxide reduction. As yet another example, bias-based treatment approach may be added to etch/sputter the via bottom residues. The bias power may be applied at low (20-300 Watts) range to avoid low-k damage at the bottom of the via.

FIG. 1 is a flow chart depicting a method 100 of forming an interconnect structure according to some implementations described herein. Method 100 is performed upon a workpiece during the fabrication process. The method 100 may be used to form a dual damascene structure as depicted in the sequence of fabrication stages depicted in FIGS. 2A-2E, which are discussed below. FIGS. 2A-2E depict cross-sectional schematic views of the fabrication processes of a dual damascene structure formed on a substrate 210. Although FIG. 1 is described with reference to a dual damascene process, it should be understood that reference to the dual damascene process is only illustrative and the processes described in FIG. 1 are applicable to any process where it is desirable to form a pore sealing layer over a porous low-k film.

At block 110, a substrate having an open feature formed in a porous low-k dielectric layer on a substrate is provided. The open feature has exposed porous low-k surfaces and exposed conductive surfaces. The open feature may include trenches, vias, holes, openings, lines, the like and combinations thereof. The porous low-k dielectric layer may be any conventional porous, low-k, silicon based dielectric layer having a k value below about 3. In one implementation, the porous low-k dielectric layer is an organosilicate glass (OSG, such as SiCOH) which is a silicon oxide that contains carbon and hydrogen atoms. The porous low-k layer may have micropores having diameters in the range of about 0.5 nanometers to about 20 nanometers. The exposed conductive surface may be any metallic material. In one implementation, the metallic material may be selected from the group consisting of: copper (Cu), cobalt (Co), tungsten (W), nickel (Ni), gold (Au), aluminum (Al) and combinations thereof.

Figure 2A:
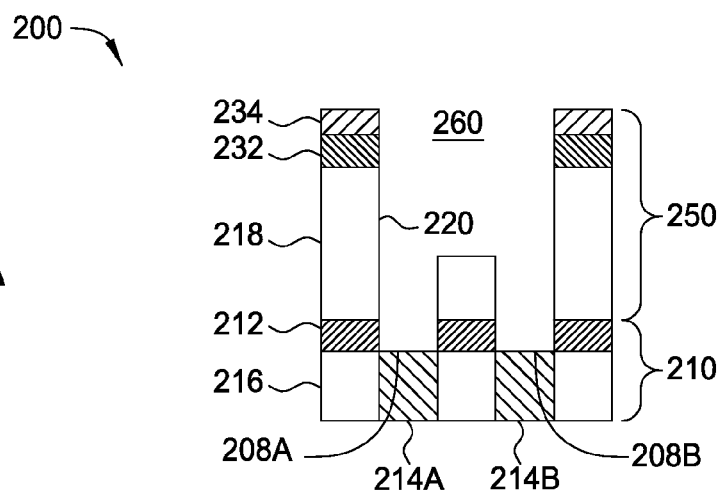
FIGS. 2A-2E depict cross-sectional schematic views of a workpiece processed according to implementations described herein.

The substrate having an open feature may be similar to substrate 210 depicted in FIGS. 2A-2E. The substrate 210 has a patterned film stack 250 formed thereon. The substrate 210 may include a semiconductor substrate and may include fully or partially formed layers and/or devices formed therein or thereupon. For example, in some implementations, and as depicted in FIG. 2A, the substrate may have a low-k dielectric barrier layer 212 disposed on top of a metal interconnect structure 214A, 214B (collectively 214) formed in a low-k dielectric layer 216. The low-k dielectric barrier layer 212 may comprise any suitable layer of material, such as silicon nitride (SiN), silicon carbide (SiC), nitrogen doped silicon carbide (SiNC), silicon carbon nitride (SiCN), silicon carbon oxide (SiCO), oxygen and nitrogen doped silicon carbide (SiONC), or the like. One example of such a silicon carbide based material is BLOk™ (barrier low-k) film, which is available from Applied Materials, Inc. of Santa Clara, Calif. The metal interconnect structure 214 may comprise a conductive material, such as a metal, for example copper (Cu), cobalt (Co), tungsten (W), nickel (Ni), gold (Au), aluminum (Al) or the like. The metal interconnect structure 214 may have an upper surface 208A, 208B (collectively 208) that is substantially coplanar or flush with an upper surface of the low-k dielectric layer 216. The low-k dielectric layer 216 may be any organic, low-k dielectric material having a dielectric constant that is less than the dielectric constant of silicon dioxide ($SiO_2$), which is about 3.9. Suitable materials for the low-k dielectric layer 216 include carbon doped oxide (CDO), organosilicate glass (OSG), undoped silicon glass (USG), such as silicon oxide or TEOS, boron-silicate glass (BSG), phosphorus-silicate glass (PSG), boron-phosphorus-silicate glass (BPSG) and combinations thereof.

In one implementation, the patterned film stack 250 includes a low-k dielectric layer 218 and one or more top layers or mask layers 232, 234 disposed thereon. The low-k dielectric layer 218 may be deposited on top of the substrate 210 (e.g., on top of the low-k dielectric barrier layer 212 when present, or any other layer that may be present on the substrate 210). The low-k dielectric layer 218 may be disposed on the low-k dielectric barrier layer 212. The low-k dielectric layer 218 may be selected from the same materials as the low-k dielectric layer 216. The low-k dielectric layers 216 and 218 may be porous as described herein. The one or more mask layers 232 and 234 may each individually be a dielectric layer selected from a group consisting of an oxide layer, a nitride layer, a metal layer, a refractory metal nitride layer, a composite of oxide and nitride layer, at least two or more oxide layers sandwiching a nitride layer, and combinations thereof, among others. Exemplary refractory metal nitride layers are selected from the group consisting of titanium nitride, tantalum nitride and tungsten nitride. Exemplary metal layers include titanium and tungsten.

The low-k dielectric layer 218 may be any organic, low-k dielectric material having a dielectric constant that is less than the dielectric constant of silicon dioxide ($SiO_2$), which is about 3.9. For example, the organic material may be a carbon doped oxide (CDO) (such as Black Diamond or Black Diamond II, available from Applied Materials), an organosilicate glass (OSG) material, a polymer-based low-k dielectric material (such as SiLK®, available from Dow Chemical Company), an organic polymer (such as FLARE™, a bridged poly-arylene ether available from Honeywell Advanced Microelectronic Materials), or the like. In an exemplary implementation depicted herein, the low-k dielectric layer 218 is an organosilicate glass (OSG) layer. In another exemplary implementation depicted herein, the low-k dielectric layer 218 is a carbon doped oxide. In one implementation, the low-k dielectric layer 218 has a thickness between about 300 Å to about 1,500 Å, such as between about 400 Å to about 1,200 Å, for example about 1,000 Å. In one implementation, mask layer 232 is a silicon rich oxide or SiON layer and mask layer 234 is a titanium containing layer (e.g., titanium nitride or titanium layer).

In the implementations depicted in FIG. 2A, the workpiece 200 has previously undergone several processes including deposition, etching and patterning processes, wherein the description of these processes are eliminated for the sake of brevity. The film stack is patterned to form the patterned film stack 250 as shown in FIG. 2A. The patterned film stack 250 may be patterned using a series of processes known to those of ordinary skill in the art to form open features 260 in the patterned film stack 250. The open features 260 typically form sidewalls 220 and expose portions of the upper surface 208 of the interconnect structure 214. The open features 260 described herein may include trenches, vias, openings, holes, lines, the like and combinations thereof. The open features 260 may be formed using a plasma etch process that includes a process gas or process gas mixture comprising a fluorocarbon gas, a nitrogen-containing gas, and an inert gas. As used herein, the phrases "a process gas" and "a process gas mixture" are interchangeable and may include one or more gases. Optionally, a hydrofluorocarbon gas may also be provided. During formation of the open feature 260, the exposed surfaces of the patterned film stack 250 may be damaged. Various repair processes may be performed to repair the damage to the exposed surfaces of the patterned film stack 250.

At block 120, the exposed dielectric and conductive surfaces of the open feature are exposed to a pre-deposition UV treatment process. The open feature may be open feature 260. The exposed surfaces may include sidewalls 220 and an exposed conductive surface, for example, the upper surface 208 of the interconnect structure 214 at the bottom of the open feature. The UV treatment process may be performed in the chamber in which the sealing layer is deposited, or in a different chamber. In one implementation, the UV treatment process is performed in a load lock chamber that is in the same mainframe as the processing chamber in which the sealing layer is deposited at block 130.

The UV assisted treatment process may include flowing a reactive gas into a chamber in which the substrate having the exposed dielectric and conductive surfaces is disposed therein. UV energy is directed to the exposed dielectric and conductive surfaces by turning on one or more UV lamps. The chamber pressure may range from about 6 Torr to about 200 Torr (e.g., from about 10 Torr to about 50 Torr; from about 20 Torr to about 30 Torr). The UV power may range from about 40 percent to about 100 percent (e.g., from about 50 percent to about 100 percent; from about 60 percent to about 90 percent; from about 70 percent to about 80 percent). The reactive gas may have a flow rate ranging from about 20 sccm to about 2,000 sccm (e.g., from about 50 sccm to about 800 sccm; from about 100 sccm to about 500 sccm). Examples of the reactive gas include $NH_3$, $H_2$, $O_2$, $N_2O$, $CO_2$, or combinations thereof. In one implementation, the reactive gas is $NH_3$. Inert gases such as Ar or He may be also introduced into the chamber at a flow rate ranging from about 20 sccm to about 2,000 sccm (e.g., from about 50 sccm to about 800 sccm; from about 100 sccm to about 500 sccm). The processing time may range from about 10 seconds to about 600 seconds (e.g., from about 60 seconds to about 300 seconds; from about 120 seconds to about 200 seconds).

The UV assisted treatment process of block 120 in a load lock chamber may include flowing a reactive gas into a load lock chamber in which the substrate having a porous low-k dielectric film disposed thereon is disposed therein. UV energy is directed to the sealing layer by turning on one or more UV lamps. The load lock chamber pressure may range from about 0.07 Torr to about 20 Torr (e.g., from about 1 Torr to about 10 Torr). The UV power may range from about 40 percent to about 100 percent (e.g., 50 percent to 100 percent; 60 percent to 90 percent; 70 percent to 80 percent). The reactive gas may have a flow rate ranging from about 20 sccm to about 2,000 sccm (e.g., about 50 sccm to about 800 sccm). The substrate temperature may be between 200 degrees Celsius and 400 degrees Celsius. Examples of the reactive gas include $NH_3$, $H_2$, $O_2$, $N_2O$, $CO_2$, or combinations thereof. In one implementation, the reactive gas is $NH_3$. Inert gas such as Ar or He may be also introduced into the chamber at a flow rate ranging from about 20 sccm to about 2,000 sccm (e.g., about 50 sccm to about 800 sccm; from about 100 sccm to about 500 sccm). The processing time may range from about 10 seconds to about 600 seconds (e.g., from about 60 seconds to about 300 seconds; from about 120 seconds to about 200 seconds).

In some implementations, the UV assisted treatment process of block 120 may be replaced by a plasma treatment.

The plasma treatment may be performed in a load lock chamber. The plasma treatment may be a remote plasma treatment. The plasma is typically generated from a suitable treatment gases, for example ammonia, hydrogen, or combinations thereof. The plasma treatment may include flowing the plasma and a carrier gas into a load lock chamber in which the substrate having a porous low-k dielectric film disposed thereon is disposed therein. A carrier gas such as ammonia, hydrogen, nitrogen, argon, helium or combinations may be introduced into the load lock chamber with the plasma. The load lock chamber pressure may range from about 500 mTorr to about 20 Torr (e.g., from about 1 Torr to about 10 Torr). The remote plasma power may range from about 200 Watts to about 5,000 Watts (e.g., from about 500 Watts to about 1,000 Watts). The carrier gas may have a flow rate ranging from about 20 sccm to about 2,000 sccm (e.g., about 50 sccm to about 800 sccm). The processing time may range from about 5 seconds to about 120 seconds.

The treatment process of block 120 may be performed in the same chamber as the UV assisted deposition process of block 130. Not to be bound by theory but it is believed that the UV assisted treatment process of the exposed dielectric and conductive surfaces increases the hydrophobicity of the exposed conductive surface relative to the exposed dielectric surface. This increased hydrophobicity of the conductive surface leads to reduced deposition of the subsequently deposited pore sealing layer at block 130 on the exposed conductive surface.

At block 130, a pore sealing layer is formed on the exposed porous low-k dielectric layer surfaces of the open feature. The pore sealing layer is selectively formed on the exposed porous low-k dielectric surfaces relative to the exposed conductive surfaces of the open feature. During deposition of the pore sealing layer in the process of block 130, a pore sealing residue may form on the exposed conductive surfaces of the open feature. The pore sealing residue may be a non-conformal pore sealing layer. The pore sealing layer is formed over the porous low-k dielectric layer at a greater deposition rate than the deposition rate of the pore sealing residue formed on the conductive surface. The pore sealing layer is thicker than the pore sealing residue. The pore sealing layer may be deposited on the porous low-k dielectric layer using ultraviolet (UV) assisted photochemical vapor deposition. The UV assisted photochemical vapor deposition may be performed in the chamber in which the porous low-k dielectric film is deposited, or in a different chamber. In one implementation, the UV assisted photochemical vapor deposition is performed in an UV processing chamber. A substrate having an exposed porous low-k dielectric film an exposed conductive surface is placed in a processing chamber.

The UV assisted photochemical vapor deposition process includes introducing a precursor compound and a carrier gas into the processing chamber and delivering UV energy to the porous low-k dielectric film disposed on the substrate by turning on one or more UV lamps. In one implementation, the precursor compound is a precursor compound comprising silicon, carbon and nitrogen. The precursor compound may be a nitrogen containing silylation agent, such as tris(dimethylamino)methylsilane, tetrakis(dimethylamino) silane, tris(dimethylamino)silane, bis(dimethylamino)dimethylsilane, bis(dimethylamino)methylvinylsilane, trisilylamine, dimethylaminotrimethylsilane, cyclotrisilazane, trimethyltrivinylcyclotrisilazane, hexamethylcyclotrisilazane, nonamethycyclotrisilazane, or other compounds containing silicon, hydrogen, nitrogen and carbon. A carrier gas may be used to assist the flow of the precursor compound into the processing chamber. The carrier gas may be an inert gas, such as He, Ar, $N_2$, and combinations thereof. In one implementation, the substrate is a 300 mm substrate, the flow rate of the precursor compound may range from about 100 milligrams per minute (mgm) to about 2,000 mgm, and the flow rate of the carrier gas may range from about 500 standard cubic centimeters per minute (sccm) to about 5,000 sccm.

The UV assisted photochemical vapor deposition process may be conducted at a processing chamber pressure between about 50 mTorr and 500 Torr (e.g., from about 100 mTorr to about 10 Torr; from about 1 Torr to about 5 Torr). The substrate temperature may be between about 100 degrees Celsius and about 400 degrees Celsius. The processing time may be between about 15 seconds to about 900 seconds. The UV power may be at about 20 percent to about 100 percent (e.g., from about 20 percent to about 80 percent; from about 30% to about 50%). The UV power may be between about 200 Watts and about 3,000 Watts (e.g., between about 1,100 Watts and about 2,500 Watts; between about 1,500 Watts and about 2,000 Watts). The pore sealing layer may have a thickness ranging from about 1 Angstrom to about 5 Angstroms for each deposition cycle. The pore sealing layer may have a total thickness of 5 to 50 Angstroms after repeating deposition cycles.

Figure 2B:
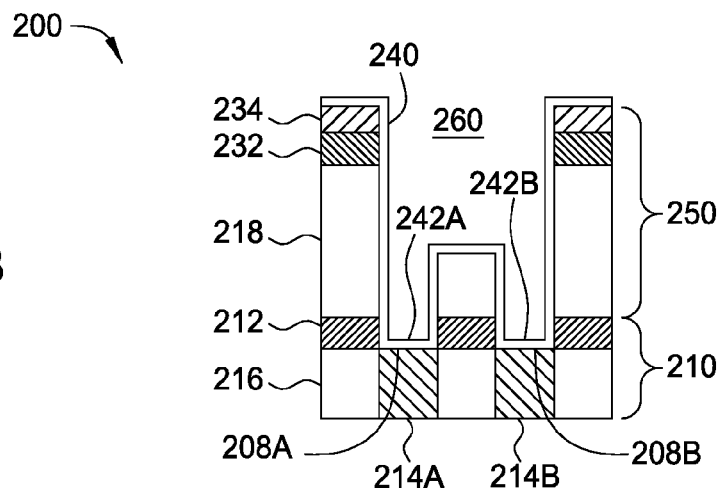
Figure 2C:
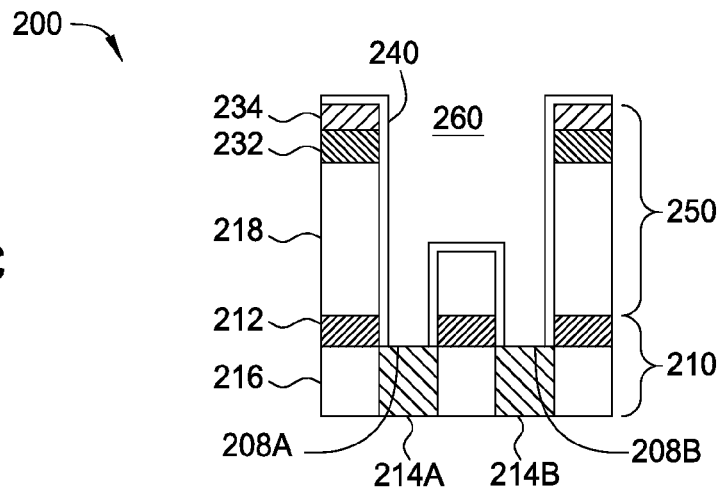

The pore sealing layer formed at block 130 may be pore sealing layer 240 as depicted in FIG. 2B. The pore sealing residue formed on the conductive surface at block 130 may be pore sealing residue 242A, 242B (collectively 242). The pore sealing layer 240 is formed at a higher deposition rate over the porous low-k insulating layer, for example, sidewall 220 relative to the deposition rate of the pore sealing residue 242 formed on the conductive surface, for example, the upper surfaces 208A, 208B of the interconnect structures 214A, 214B. Thus the portion of the pore sealing layer 240 formed over the porous low-k insulating layer is thicker than the portion of the pore sealing residue 242 formed over the conductive surfaces.

At block 140, the deposited pore sealing layer may be exposed to a post-deposition treatment process. The treatment process may be a UV assisted treatment process. The treatment process may be performed in the chamber in which the pore sealing layer is deposited, or in a different chamber. In one implementation, the treatment process is performed in a load lock chamber that is in the same mainframe as the processing chamber in which the sealing layer is deposited. The UV assisted treatment process may include flowing a reactive gas into a chamber in which the substrate having a porous low-k dielectric film and a pore sealing layer disposed thereon is disposed therein. UV energy is directed to the sealing layer by turning on one or more UV lamps. The chamber pressure may range from about 6 Torr to about 200 Torr (e.g., from about 10 Torr to about 50 Torr; from about 20 Torr to about 30 Torr). The UV power may be at about 20 percent to about 100 percent (e.g., from about 20 percent to about 80 percent; from about 30 percent to about 50 percent). The UV power may be between about 200 Watts and about 1,000 Watts (e.g., between about 200 Watts and about 500 Watts; between about 250 Watts and about 350 Watts). The reactive gas may have a flow rate ranging from about 20 sccm to about 2,000 sccm (e.g., about 50 sccm to about 800 sccm). Examples of the reactive gas include $NH_3$, $H_2$, $O_2$, $N_2O$, $CO_2$, or combinations thereof. Inert gases such as Ar or He may be also introduced into the chamber at a flow rate ranging from about 20 sccm to about 2,000 sccm (e.g., about 50 sccm to about 800 sccm). The substrate temperature may be between 200 degrees Celsius and 400 degrees Celsius. The processing time may range from about 10 seconds to about 600 seconds (e.g., from about 60 seconds to about 300 seconds; from about 120 seconds to about 200 seconds).

The UV assisted treatment process in a load lock chamber may include flowing a reactive gas into a load lock chamber in which the substrate having a porous low-k dielectric film and a sealing layer disposed thereon is disposed therein. UV energy is directed to the sealing layer by turning on one or more UV lamps. The load lock chamber pressure may range from about 0.07 Torr to about 20 Torr. The UV power may be at about 20 percent to about 100 percent (e.g., from about 20 percent to about 80 percent; from about 30 percent to about 50 percent). The UV power may be between about 200 Watts and about 1,000 Watts (e.g., between about 200 Watts and about 500 Watts; between about 250 Watts and about 350 Watts). The reactive gas may have a flow rate ranging from about 20 sccm to about 2,000 sccm (e.g., about 50 sccm to about 800 sccm). Example of the reactive gas includes $NH_3$, $H_2$, $O_2$, $N_2O$, $CO_2$, or combinations thereof. Inert gas such as Ar or He may be also introduced into the chamber at a flow rate ranging from about 20 sccm to about 2,000 sccm (e.g., about 50 sccm to about 800 sccm). The substrate temperature may be between 200 degrees Celsius and 400 degrees Celsius. The processing time may range from about 10 seconds to about 600 seconds(e.g., from about 60 seconds to about 300 seconds; from about 120 seconds to about 200 seconds).

In some implementations, the UV assisted treatment process of block 140 may be replaced by a plasma treatment. The plasma treatment may be performed in a load lock chamber. The plasma treatment may be a remote plasma treatment. The plasma is typically generated from a suitable treatment gases, for example ammonia, hydrogen, or combinations thereof. The plasma treatment may include flowing the plasma and a carrier gas into a load lock chamber in which the substrate having a porous low-k dielectric film disposed thereon is disposed therein. A carrier gas such as ammonia, hydrogen, nitrogen, argon, helium or combinations may be introduced into the load lock chamber with the plasma. The load lock chamber pressure may range from about 500 mTorr to about 20 Torr. The remote plasma power may range from about 200 Watts to about 5,000 Watts. The carrier gas may have a flow rate ranging from about 20 sccm to about 2,000 sccm (e.g., about 50 sccm to about 800 sccm). The processing time may range from about 5 seconds to about 120 seconds.

The treatment process may be performed in the same chamber as the UV assisted deposition process. In one implementation, a processing chamber is capable to perform both the UV assisted deposition process and the UV treatment process. The treatment process of the sealing layer generates more reactive sites on the surface of the sealing layer, leading to an improved film quality as a subsequent sealing layer is deposited on the treated sealing layer. The depositing of a sealing layer and the treating of the sealing layer may be repeated until the resulting sealing layer achieves a predetermined thickness. The pore sealing layer may have a thickness ranging from about 1 Angstrom to about 5 Angstroms for each deposition cycle. In one implementation, the predetermined thickness ranges from about 5 Angstroms to about 200 Angstroms (e.g., about 5 Angstroms to about 50 Angstroms) after repeating deposition cycles. The thickness of the resulting sealing layer may depend on the application. If one deposition process and one treatment process are considered a cycle, the number of cycles may range from about 2 to 100.

In one implementation, the UV assisted photochemical vapor deposition process of block 130 and the UV treatment of block 140 may be a continuous UV treatment with the process gases of block 130 being stopped to perform the UV treatment of block 140.

As shown in FIG. 1, at block 150, if the pore sealing layer has not reached a predetermined thickness, at least one of blocks 130 and 140 are repeated. Each time an intermediate pore sealing layer is deposited on the previously deposited and treated pore sealing layer, the surface of the intermediate pore sealing layer is treated for the next pore sealing layer to be deposited thereon. If the resulting pore sealing layer has reached the predetermined thickness, the subsequent treating process may not be performed. The number of cycles may depend on the desired thickness of the resulting pore sealing layer. By using the cyclic process, a pore sealing layer is conformally deposited on the porous low-k dielectric layer and can effectively reduce the porosity of the porous low-k dielectric layer at the surface of the porous low-k dielectric layer.

At block 160, an optional post-deposition treatment process may be performed to remove pore sealing residue from the exposed conductive surfaces. The removed pore sealing residue may be pore sealing residue 242. The optional post-treatment process may also remove any oxide contaminants that have formed on the conductive surface. Any optional post-treatment process that is sufficient for removal of the pore sealing residue, removal of oxide contaminants, or both from the conductive surface may be used. The post-treatment process may be a dry etching process, a wet etching process, or both.

In one implementation, the post-treatment process is a remote plasma assisted dry etching type process, which includes the simultaneous exposure of a substrate to $NF_3$ and $NH_3$ plasma by-products. In one example, the plasma etch process may be similar to or may include a SiCoNi® etch process that is available from Applied Materials, Inc. of Santa Clara, Calif. In some implementations, the post-treatment process includes the use of a remote plasma excitation source that provides energy to the process gases so that the excited gas species do not damage the substrate during processing. The remote plasma etch can be largely selective towards the pore sealing residue on the conductive surfaces.

In another implementation, the post-treatment process is a wet etching type process, which may include exposure of the workpiece to a diluted hydrofluoric acid ("HF") solution (e.g., about 6:1 to about 1100:1 ratio of $H_2O$:HF; about 800:1 to about 1000:1 ratio of $H_2O$:HF). The wet etching type process may contain an oxidizer, such as peroxide and adjusted pH levels for improved dissolution. As another example, a lift-off method may be use to clean the via bottom to remove oxide residues. The process can be an acetic acid clean based oxide reduction.

In another implementation, the post-treatment process is a wet etching type process, which may include exposure of the workpiece to an acetic acid based solution. In one implementation, the acetic acid based solution may contain less than approximately 20% by weight water (e.g., between approximately 1% and 20% by weight water, and in a particular implementation to clean a substrate having copper metallization the acetic acid based solution may be between approximately 1% and 10% byweight water (e.g., between approximately 1% and 5% by weight water). The acetic acid based cleaning solution may also include a surfactant. The surfactant may be a mixture of a polyoxyethylene ether surfactant and an ethoxylated alcohol surfactant.

In yet another implementation, the post-treatment process is a sputtering clean process. The sputtering dean process may be an argon sputtering dean process. In one implementation, the sputtering dean process is performed with a RF bias power of between about 10 Watts and about 1,000 Watts (between about 10 Watts and about 400 Watts; between about 20 Watts and 300 Watts; between about 50 Watts and 100 Watts). The sputtering dean process may be performed at a plasma power of between 225 W and 300 W. The gas flow is may be between about 3 sccm and 100 sccm. The duration of the sputtering clean process may be between about 5 sec and 35 sec. The sputtering process may be performed in process chambers configured to perform a plasma etch process, for example, pre-clean chambers with argon sputtering capabilities. Examples of suitable plasma etch process chambers include any of the PC-XT® line of processing chambers, or the Preclean II line of preclean chambers, commercially available from Applied Materials, Inc., of Santa Clara, Calif.

Figure 2D:
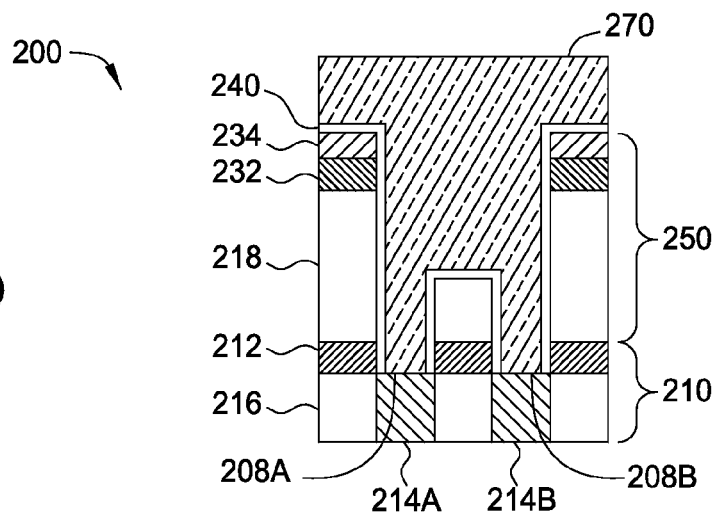
Figure 2E:
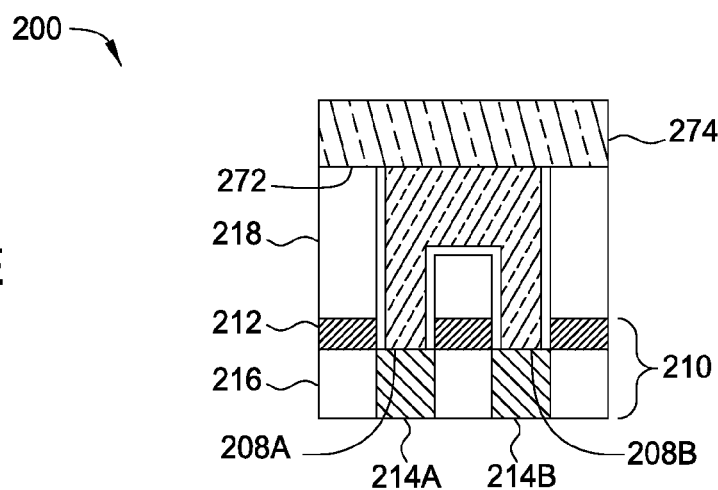

Additional processing of the workpiece 200 may be performed after the process of block 160. For example, the dual damascene structure may be filled with a conductive material 270, as shown in FIG. 2D. The conductive material 270 may comprise any suitable materials, for example metals, such as copper, aluminum, alloys thereof, or the like. The conductive material 270 may be deposited by any suitable process, such as plating, chemical or physical deposition, or the like. The workpiece 200 may be exposed to a polishing process (e.g., chemical mechanical polishing) to remove a portion of the conductive material 270, mask layer 232 and mask layer 234 to expose a top portion 272 of the low-k dielectric layer 218 followed by deposition of a barrier layer 274, as shown in FIG. 2E. After deposition of the barrier layer 274, the process ends and the substrate may continue for further processing, for example, to complete the formation of devices being formed thereon, or otherwise as desired.

Figure 3:
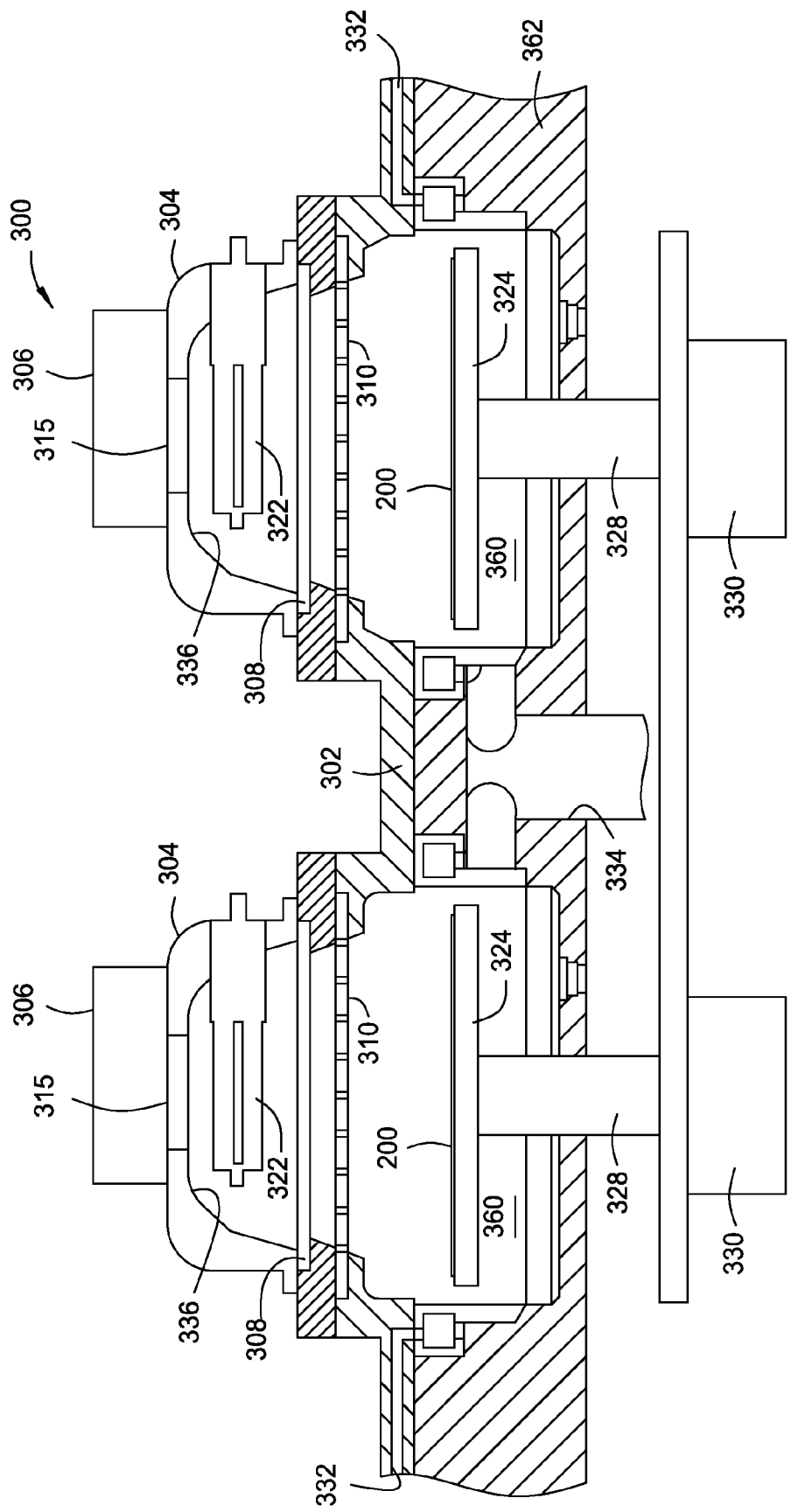
FIG. 3 is a cross-sectional view of a UV thermal treatment chamber in which implementations of the present disclosure may be practiced.

FIG. 3 illustrates a cross-sectional view of a twin volume processing system 300. The processing system 300 illustrates an exemplary implementation of a 300 mm, or 450 mm PRODUCER® processing system, commercially available from Applied Materials, Inc., of Santa Clara, Calif. The implementations described herein may also be advantageously employed on PRODUCER® NANOCURE™ and PRODUCER® ONYX™ systems, both available from Applied Materials, Inc., of Santa Clara, Calif., or other suitably adapted processing systems, including those from other manufacturers.

The processing system 300 provides two separate and adjacent processing regions in a chamber body for processing the substrates. The processing system 300 has a lid 302, housings 304 and power sources 306. Each of the housings 304 cover a respective one of two UV lamps 322 disposed respectively above two processing regions 360 defined within the body 362. Each of the processing regions 360 includes a heating substrate support, such as substrate support 324, for supporting workpiece 200 within the processing regions 360. The UV lamps 322 emit UV light that is directed through the windows 308 and showerheads 310 onto each substrate located within each processing region. The substrate supports 324 can be made from ceramic or metal such as aluminum. The substrate supports 324 may couple to stems 328 that extend through a bottom of the body 362 and are operated by drive systems 330 to move the substrate supports 324 in the processing regions 360 toward and away from the UV lamps 322. The drive systems 330 can also rotate and/or translate the substrate supports 324 during curing to further enhance uniformity of substrate illumination. The exemplary tandem processing system 300 may be incorporated into a processing system, such as a Producer™ processing system, commercially available from Applied Materials, Inc., of Santa Clara, Calif.

The UV lamps 322 can be an array of light emitting diodes or bulbs utilizing any suitable UV illumination sources including, but not limited to, microwave arcs, radio frequency filament (capacitively coupled plasma) and inductively coupled plasma (ICP) lamps. The UV light can be pulsed during a cure process. Various concepts for enhancing uniformity of substrate illumination include use of lamp arrays which can also be used to vary wavelength distribution of incident light, relative motion of the substrate and lamp head including rotation and periodic translation (sweeping), and real-time modification of lamp reflector shape and/or position. The UV lamps 322 are a source of ultraviolet radiation, and may transmit a broad spectral range of wavelengths of UV and infrared (IR) radiation.

The UV lamps 322 may emit light across a broad band of wavelengths from 170 nm to 400 nm. The gases selected for use within the UV lamp 322 can determine the wavelengths emitted. UV light emitted from the UV lamps 322 enters the processing regions 360 by passing through windows 308 and gas distribution showerheads 310 disposed in apertures in the lid 302. The windows 308 may be made of an OH free synthetic quartz glass and have sufficient thickness to maintain vacuum without cracking. The windows 308 may be fused silica that transmits UV light down to approximately 150 nm. The showerheads 310 may be made of transparent materials such as quartz or sapphire and positioned between the windows 308 and the substrate support 324. Since the lid 302 seals to the body 362 and the windows 308 are sealed to the lid 302, the processing regions 360 provide volumes capable of maintaining pressures from approximately 1 Torr to approximately 650 Torr. Processing or cleaning gases may enter the processing regions 360 via a respective one of two inlet passages 332. The processing or cleaning gases then exit the processing regions 360 via a common outlet port 334.

Each of the housings 304 includes an aperture 315 adjacent the power sources 306. The housings 304 may include an interior parabolic surface defined by a cast quartz lining 336 coated with a dichroic film. The dichroic film usually constitutes a periodic multilayer film composed of diverse dielectric materials having alternating high and low refractive index. Therefore, the quartz linings 336 may transmit infrared light and reflect UV light emitted from the UV lamp 322. The quartz linings 336 may be adjusted to better suit each process or task by moving and changing the shape of the interior parabolic surface.

The implementations disclosed herein enable pore sealing of porous lower-k films within an interconnect integration flow process. The implementations provide capacitance benefits from using porous low-k films, good reliability by pore sealing and good via contact by residue removal.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
exposing a substrate to UV radiation and a first reactive gas comprising $NH_3$, wherein the substrate has an open feature defined therein, the open feature defined by exposed surfaces of a porous low-k dielectric layer and an exposed upper surface of a conductive material, wherein the porous low-k dielectric layer is a silicon and carbon containing material, wherein the exposing a substrate to UV radiation and a first reactive gas increases the hydrophobicity of the exposed upper surface of the conductive material relative to the exposed surfaces of the porous low-k dielectric layer, wherein the exposed upper surface of the conductive material defines a bottom surface of the open feature, and wherein the exposed surfaces of the porous low-k dielectric layer define a sidewall of the open feature; and selectively forming a pore sealing layer in the open feature on the UV treated exposed surfaces of the porous low-k dielectric layer and forming a pore sealing residue on the UV treated exposed upper surface of the conductive material using a UV assisted photochemical vapor deposition, wherein the pore sealing layer and the pore sealing residue are a silicon-carbon-nitrogen based film, and wherein a deposition rate of the pore sealing layer on the UV treated exposed surfaces of the porous low-k dielectric layer of the open feature is greater than a deposition rate of the pore sealing residue on the UV treated exposed upper surface of the conductive material of the open feature.

2. The method of claim 1, wherein the UV assisted photochemical vapor deposition comprises:

exposing the substrate to a carrier gas and a precursor compound comprising silicon, carbon and nitrogen while delivering UV radiation to the porous low-k dielectric layer.

3. The method of claim 2, further comprising:

exposing the deposited pore sealing layer to UV radiation after the exposing a substrate to a carrier gas and a precursor compound comprising silicon, carbon and nitrogen.

4. The method of claim 3, further comprising:

repeating the UV assisted photochemical vapor deposition and the exposing the deposited pore sealing layer to UV radiation after the exposing a substrate to a carrier gas and a precursor compound comprising silicon, carbon and nitrogen until the pore sealing layer achieves a predetermined thickness.

5. The method of claim 4, further comprising:

exposing the substrate to a post-deposition treatment process to remove the pore sealing residue from the conductive material of the open feature.

6. The method of claim 4, further comprising:

filling the open feature with a conductive material.

7. The method of claim 2, wherein the precursor compound is tris(dimethylamino)methylsilane, tetrakis(dimethylamino)silane, tris(dimethylamino)silane, bis(dimethylamino)dimethylsilane, bis(dimethylamino)methylvinylsilane, trisilylamine, dimethylaminotrimethylsilane, cyclotrisilazane, trimethyltrivinyl-cyclotrisilazane, hexamethylcyclotrisilazane, nonamethycyclotrisilazane, or combinations thereof.

8. The method of claim 2, wherein the carrier gas is helium, argon, nitrogen, or combinations thereof.

9. The method of claim 1, wherein the pore sealing layer has a thickness ranging from about 1 Angstrom to about 5 Angstroms for each deposition cycle.

10. The method of claim 3, wherein the exposing the deposited pore sealing layer to UV radiation comprises flowing a second reactive gas into a chamber in which the substrate is disposed.

11. The method of claim 10, wherein the second reactive gas is $NH_3$, $H_2$, $O_2$, $N_2O$, $CO_2$, or combinations thereof.

12. The method of claim 11, wherein the exposing the deposited pore sealing layer to UV radiation is conducted at a chamber pressure between about 6 Torr and 200 Torr.

13. The method of claim 4, wherein the predetermined thickness ranges from about 5 Angstroms to about 200 Angstroms.

14. The method of claim 1, wherein the open feature is selected from trenches, vias, holes, openings, lines, and combinations thereof.

15. A method, comprising:

exposing a substrate to UV radiation and an $NH_3$ precursor, wherein the substrate has a trench and via defined therein, the trench and via defined by exposed surfaces of a porous low-k dielectric layer and an exposed upper surface of a conductive material, wherein the porous low-k dielectric layer is a silicon and carbon containing material, wherein the exposing a substrate to UV radiation and an $NH_3$ precursor increases the hydrophobicity of the exposed upper surface of the conductive material relative to the exposed surfaces of the porous low-k dielectric layer, and wherein the exposed upper surface of the conductive material defines a bottom surface of the via;

selectively forming a pore sealing layer on the UV treated exposed surfaces of the porous low-k dielectric layer in the via and forming a pore sealing residue on the UV treated exposed upper surface of the conductive material at the bottom of the via using a UV assisted photochemical vapor deposition, wherein the pore sealing layer and the pore sealing residue are a silicon-carbon-nitrogen based film; and exposing the substrate to a post-deposition treatment process to remove pore sealing residue from the exposed upper surface of the conductive material of the via, wherein a deposition rate of the pore sealing layer on the exposed surfaces of the porous low-k dielectric layer is greater than a deposition rate of the pore sealing residue on the exposed upper surface of the conductive material.

16. The method of claim 15, wherein the post-deposition treatment is a dry etching process, a wet etching process, or combinations thereof.

17. The method of claim 15, wherein the UV assisted photochemical vapor deposition comprises:

exposing the substrate to a carrier gas and a precursor compound comprising silicon, carbon and nitrogen while delivering UV radiation to the substrate.

18. The method of claim 17, further comprising:

exposing the deposited pore sealing layer to UV radiation after the exposing the substrate to a carrier gas and a precursor compound comprising silicon, carbon and nitrogen.

19. The method of claim 15, wherein the exposing the deposited pore sealing layer to UV radiation comprises flowing a second reactive gas comprising $NH_3$ into a chamber in which the substrate is disposed.

* * * * *

UNITED STATES PATENT AND TRADEMARK OFFICE
CERTIFICATE OF CORRECTION

PATENT NO. : 9,793,108 B2
APPLICATION NO. : 14/750778
DATED : October 17, 2017
INVENTOR(S) : He Ren et al.

It is certified that error appears in the above-identified patent and that said Letters Patent is hereby corrected as shown below:

On the Title Page

In item (73), in Column 1, in "Assignee", Line 1, delete "APPLIED MATERIAL, INC." and insert -- APPLIED MATERIALS, INC. --, therefor.

In the Specification

In Column 10, Line 63, delete "byweight" and insert -- by weight --, therefor.

In Column 11, Line 2, delete "dean" and insert -- clean --, therefor.

In Column 11, Line 3, delete "dean" and insert -- clean --, therefor.

In Column 11, Line 4, delete "dean" and insert -- clean --, therefor.

In Column 11, Line 8, delete "dean" and insert -- clean --, therefor.

In the Claims

In Column 13, Line 56, in Claim 7, delete "trimethyltrivinylcyclo-trisilazane," and insert -- trimethyltrivinylcyclotrisilazane, --, therefor.

Signed and Sealed this
Fifth Day of December, 2017

Joseph Matal
*Performing the Functions and Duties of the
Under Secretary of Commerce for Intellectual Property and
Director of the United States Patent and Trademark Office*